United States Patent
Beintner et al.

(10) Patent No.: US 7,129,564 B2
(45) Date of Patent: Oct. 31, 2006

(54) STRUCTURE AND METHOD OF FORMING A NOTCHED GATE FIELD EFFECT TRANSISTOR

(75) Inventors: Jochen Beintner, Wappingers Falls, NY (US); Yujun Li, Poughkeepsie, NY (US); Naim Moumen, Austin, TX (US); Porshia Shane Wrschka, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/059,819

(22) Filed: Feb. 17, 2005

(65) Prior Publication Data

US 2005/0158927 A1  Jul. 21, 2005

Related U.S. Application Data

(62) Division of application No. 10/249,771, filed on May 6, 2003, now Pat. No. 6,905,976.

(51) Int. Cl.
*H01L 31/117* (2006.01)
(52) U.S. Cl. .................. 257/616; 257/19; 257/192; 257/412; 257/E21.198; 257/E21.205
(58) Field of Classification Search .............. 257/616, 257/407, 19, 192
See application file for complete search history.

(56) References Cited

U.S. PATENT DOCUMENTS 6,548,862 B1 * 4/2003 Ryu et al. ............... 257/331
6,709,912 B1 * 3/2004 Ang et al. ............... 438/199
2002/0155665 A1 10/2002 Doris et al.
2003/0219971 A1 * 11/2003 Cabral et al. ............ 438/622

FOREIGN PATENT DOCUMENTS

| JP | 04-348038 | 12/1992 |
|----|-----------|---------|
| JP | 07-202184 | 8/1995 |
| JP | 2001-320045 | 11/2001 |
| JP | 2002-329861 | 11/2002 |
| WO | WO 02/41383 A1 | 5/2002 |

* cited by examiner

*Primary Examiner*—Kenneth Parker
*Assistant Examiner*—José R. Diaz
(74) *Attorney, Agent, or Firm*—Steven Capella

(57) ABSTRACT

The structure and method of forming a notched gate MOSFET disclosed herein addresses such problems as device reliability. A gate dielectric (e.g. gate oxide) is formed on the surface of an active area on the semiconductor substrate, preferably defined by an isolation trench region. A layer of polysilicon is then deposited on the gate dielectric. This step is followed by depositing a layer of silicon germanium) (SiGe). The sidewalls of the polysilicon layer are then laterally etched, selective to the SiGe layer to create a notched gate conductor structure, with the SiGe layer being broader than the underlying polysilicon layer. Sidewall spacers are preferably formed on sidewalls of the SiGe layer and the polysilicon layer. A silicide layer is preferably formed as a self-aligned silicide from a polysilicon layer deposited over the SiGe layer, to reduce resistance of the gate conductor. One or more other processing steps (e.g. source and drain implants, extension implants, and pocket lightly doped drain (LDD) implants), gate conductor stack doping, and silicidation are preferably performed in completing the transistor.

8 Claims, 5 Drawing Sheets

US 7,129,564 B2

STRUCTURE AND METHOD OF FORMING A NOTCHED GATE FIELD EFFECT TRANSISTOR

CROSS REFERENCE TO RELATED APPLICATIONS

This application is a divisional of U.S. patent application Ser. No. 10/249,771, filed on May 6, 2003, now U.S. Pat. No. 6,905,976, the disclosure of which is incorporated herein by reference.

BACKGROUND OF INVENTION

The present invention relates to a semiconductor processing method and structure, and more specifically to a notched gate field effect transistor having a plurality of different material semiconductor layers in which an underlying layer is etched selective to a material of an overlying layer to create a notched gate transistor structure for enhanced performance.

A metal oxide semiconductor field effect transistor (MOSFET) includes an insulated gate having one or more gate conductor layers overlying a gate dielectric layer, over a substrate of single crystal semiconductor. The gate conductor usually includes a layer of polysilicon material, and the gate dielectric layer is often composed of an oxide such as silicon dioxide when the substrate is silicon. A metal silicide layer is usually formed over the polysilicon layer to reduce the resistance of the gate conductor. Sometimes an overlying metal layer (e.g. tungsten) forms part of the gate conductor.

The MOSFET is electrically isolated from other integrated circuit devices within the semiconductor substrate by isolation structures, e.g. shallow trench isolations. The area between shallow trench isolations determines the active device area within the semiconductor substrate in which MOSFETs, and possibly other devices are fabricated.

On either side of the gates of MOSFETs, source-drain regions as well as source-drain extensions regions are formed within the substrate. The MOSFET source-drain extensions are shallow regions having shallow junctions to minimize short-channel effects. The source-drain extensions are usually lightly doped, as opposed to source-drain regions, which are more heavily doped regions. In general, doped regions are regions that contain a higher concentration of P-type or N-type dopants than the substrate.

An important objective, long recognized in the advancement of integrated circuit (IC) technology, is the scaling-down of IC dimensions. Such scaling-down of IC dimensions reduces component and signal line capacitance and is critical to obtaining higher speed performance of integrated circuits. Moreover, reducing the area of an IC die leads to higher yield in IC fabrication. Such advantages are a driving force to constantly scale down IC dimensions and create even smaller MOSFET designs as a basic building block of the IC. As the dimensions of MOSFETs are scaled down to tens of nanometers, however, the parasitic capacitance due to overlap of the gate dielectric over the drain extension and the source extension, known as the "Miller capacitance, becomes significant in limiting the speed performance of the MOSFET, as is known to those skilled in the art. As one way of solving this particular problem, notched gate structures are formed. MOSFETs having notched gates have gate conductors in which a lower layer is etched to become narrower. In such manner, the length of the transistor channel is reduced, thereby leading to increased on current and improved device performance.

A problem often encountered in the fabrication of notched gate structures, however, stems from the issues created when the length of gate conductor is reduced. Since the width of the gate conductor determines the corresponding length of the transistor channel, the transistor channel length when reduced horizontally, is also reduced in the vertical direction. Accordingly, the vertical thickness of the shallow source-drain extension regions must also be reduced. However, controlling the vertical thickness of the shallow source-drain extensions requires precise control of dopant distribution on a fine scale, which is becoming prohibitively difficult within the limitations and reliability considerations for the design of notched gate and other gate conductor structures.

In most instances, the design of notched gates is dependent on the reliability of the gate dielectric that is used. Unfortunately, the available gate dielectrics are not proven to be reliable to provide consistent and uniform dielectric strength, low leakage, and protection against premature breakdown. Therefore, a new structure and method is sought for providing MOSFETs having notched gates.

SUMMARY OF INVENTION

The present structure and method of forming a notched gate MOSFET addresses such problems as device reliability. A gate dielectric (e.g. gate oxide) is formed on the surface of an active area on the semiconductor substrate, preferably defined by an isolation trench region. A layer of polysilicon is then deposited on the gate dielectric. This step is followed by depositing a layer of silicon germanium) (SiGe). The sidewalls of the polysilicon layer are then laterally etched, selective to the SiGe layer to create a notched gate conductor structure, with the SiGe layer being broader than the underlying polysilicon layer. Sidewall spacers are preferably formed on sidewalls of the SiGe layer and the polysilicon layer. A silicide layer is preferably formed over the SiGe layer after forming the sidewall spacers to reduce resistance of the gate conductor. Such silicide layer is preferably formed as a salicide (self-aligned silicide) from a layer of polysilicon deposited over the SiGe layer. One or more other processing steps (e.g. source and drain implants, gate stack doping (polysilicon and SiGe layers), silicidation, extension implants, and pocket lightly doped drain (LDD) implants) are preferably performed in completing the transistor.

Preferably, in order to achieve the notched gate structure, the underlying polysilicon layer is laterally etched, e.g. by isotropic wet etch selective to the SiGe layer. A preferred etching method includes alternating steps of rinsing to form a protective oxide on the SiGe layer, and etching the polysilicon layer therebetween.

DETAILED DESCRIPTION

FIGS. 1 through 12 illustrate embodiments including a device structure and method for making a device to form a metal oxide semiconductor field effect transistor (MOSFET) having a notched gate conductor structure.

Figure 1A:
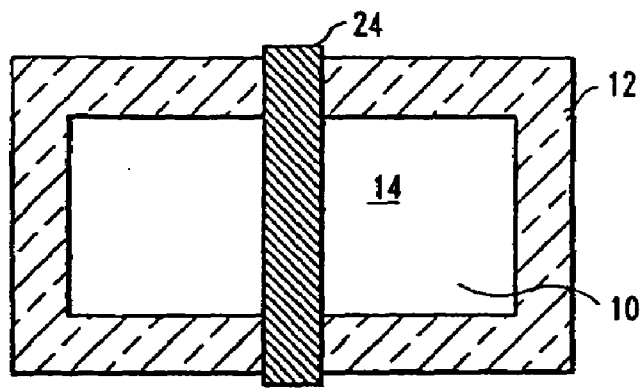
FIG. 1A is a top down view illustrating a completed device embodiment of the invention.

FIG. 1A provides a top-down view of the MOSFET device according to an embodiment of the invention. A trench isolation, preferably a shallow trench isolation 12, defines an active area 10 formed within the semiconductor or semiconductor-on-insulator (SOI) substrate. It should be noted that the location of the trench isolation 12 and its particular geometry can vary based on the desired structure. The main objective for providing the trench isolation is to electrically isolate the MOSFET from other (neighboring) devices within the same semiconductor substrate. The placement and shape of the isolation are not critical, as long as isolation integrity is maintained.

A gate conductor 24 is located over the active area 10. The top-down view of the gate conductor 24 prevents the sidewall features and an underlying gate dielectric layer from being viewed individually in FIG. 1A. To help make these and other obstructed elements identifiable, FIG. 1B is introduced which provides a cross-sectional view of the MOSFET embodiment shown in FIG. 1A.

Figure 1B:
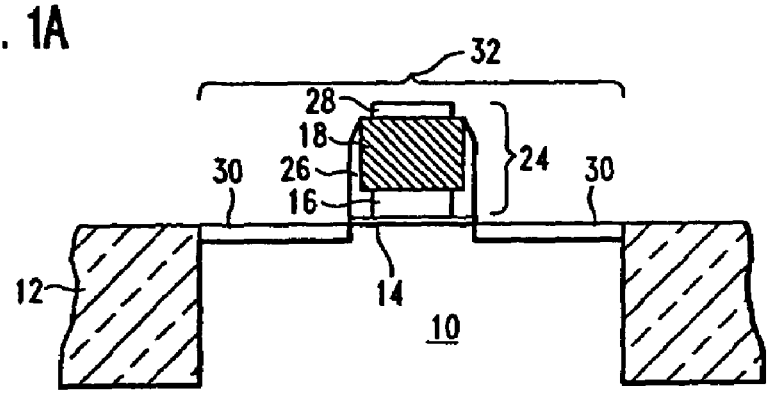
FIG. 1B provides a cross sectional view of the device embodiment illustrated in FIG. 1A.

FIG. 1B illustrates, in cross-section, the structure of the MOSFET 32 having a notched gate structure. As shown in FIG. 1B, the MOSFET 32 includes a gate conductor 24 overlying a gate dielectric layer, as provided at 14. The gate dielectric layer 14 can be made of any suitable dielectric known to those of ordinary skill in the art, and is preferably comprised of silicon dioxide. The gate conductor 24 includes a polysilicon layer 16, which provides an underlying layer in the notched gate conductor structure. A layer 18 of silicon germanium (SiGe) overlies the underlying polysilicon layer 16. A layer of a metal silicide 28, preferably formed by a self-aligned process (a "salicide") overlies the SiGe layer 18. The SiGe layer 18 is broader than the underlying layer of polysilicon 16, and can be broader than the self aligned silicide layer 28 that is formed over the SiGe layer 18. The gate conductor 24 also includes sidewall spacers 26, preferably of silicon nitride, which cover the exposed sidewalls of the notched gate structure. In the embodiment shown in FIG. 1B, spacers 26 are formed along the sidewalls of the SiGe layer 18 and the underlying polysilicon layer 16, but do not cover the sidewalls of the silicide layer 28. As further shown in FIG. 1B, the MOSFET 32 includes a pair of source and drain regions 30 on each side of the gate conductor 24.

In MOSFET 32, the source and drain regions 30 each contain a deep contact junction, and preferably include source and drain extensions. Source and drain extensions are shallow, lightly doped areas, while source and drain contact junctions are deep and heavily doped. The purpose of source and drain extensions are to minimize short channel effects, and to maintain other device characteristics such as threshold voltage rolloff and punchthrough, and to reduce hot carrier injection (HCI) in MOSFETs having submicron or nanometer dimensions. The source/drain contact junctions are deep, so that a drain or source silicide can be formed on the top surface thereof, if desired. Thicker, (deep) source-drain regions are generally important for lowering device resistivity, as well as increasing current flow and forming good electrical contact regions. Deep source and drain contact junctions permit a relatively large size silicide to be formed on the drain and/or source, thereby providing low resistance contact to the drain and source. Therefore, as per one embodiment of the present method, source and drain regions 30 are silicided.

As described above, FIGS. 1A and 1B illustrate a notched gate MOSFET embodiment of the invention, while FIGS. 2–12 illustrate processing steps in a method for making a MOSFET having a notched gate structure.

Figure 2A:
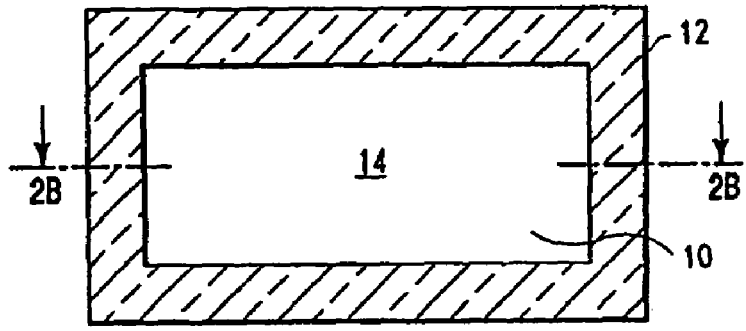
FIGS. 2A and 2B are a top down view, and a cross-sectional view, respectively, illustrating an initial stage in a method embodiment of the invention.
Figure 2B:
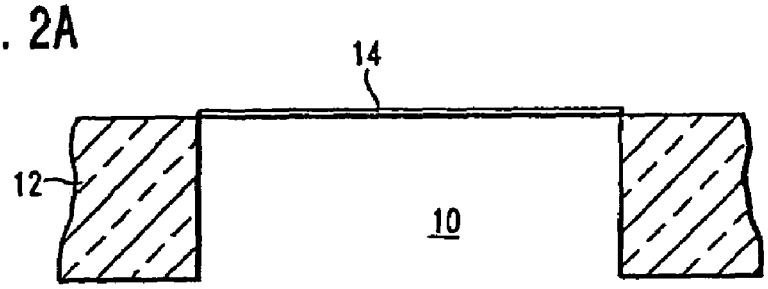

FIG. 2A provides a top-down view corresponding to the one illustrated in FIG. 1A, while FIG. 2B is a cross-sectional view of the embodiment shown in FIG. 2A. The cross sectional view of FIG. 2B corresponds to the cross-sectional view illustrated in FIG. 1B.

Both FIGS. 2A and 2B illustrate the isolation trench 12 defining the active area 10, provided prior to forming the notched gate structure shown in FIGS. 1A and 1B. The substrate and the active area 10 therein preferably comprise single crystal silicon, for ease of fabrication. As shown in FIG. 2A, an active area 10 is isolated from neighboring areas of the substrate by a trench isolation 12. As shown in FIG. 2B, a gate dielectric layer 14 is formed over the active area 10. In a preferred embodiment, the gate dielectric layer 14 is formed as a gate oxide by local oxidation of the underlying substrate, which is preferably composed of silicon. However, other techniques for forming a gate dielectric and/or other materials may be used, as suited to the requirements of the device and fabrication process, as known to those skilled in the art.

Figure 3:
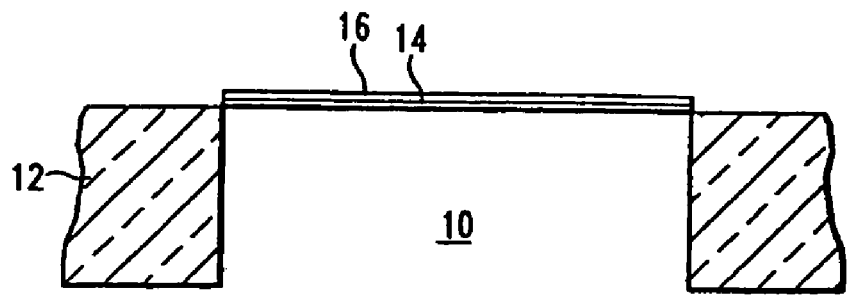
FIG. 3 is a cross-sectional view illustrating a subsequent stage following that illustrated in FIGS. 2A and 2B, in which a gate oxide layer and a polysilicon layer have been formed over the active area of the substrate.

FIG. 3 provides illustrates a next stage in processing, subsequent to that illustrated in FIGS. 2A and 2B. In FIG. 3, a layer of polysilicon 16 is deposited over the gate oxide layer shown at 14. The polysilicon layer 16 is doped according to work function needs, and requirements for interfacing with the gate dielectric layer 14 below, and according to the conductivity type (n-type or p-type) of the MOSFET 32 being fabricated.

Figure 4:
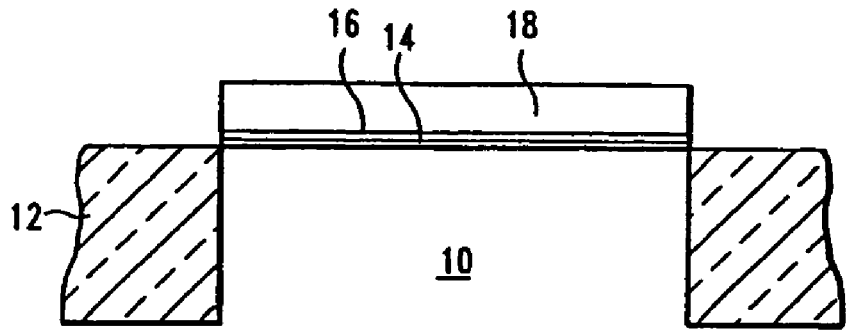
FIG. 4 is a cross-sectional view illustrating a subsequent stage, after the deposition of a silicon germanium (SiGe) layer.

FIG. 4 illustrates a next stage in processing, subsequent to that in FIG. 3. In FIG. 4, a new layer is deposited over the polysilicon/gate dielectric stack shown in FIG. 3. The new layer deposited over the polysilicon layer 16 is a polycrystalline layer 18 of silicon germanium (SiGe). The deposited SiGe layer 18 is doped according to work function needs and requirements for interfacing to the materials, i.e. underlying polysilicon layer 16, with which it is in contact. Next, as illustrated in FIG. 5, another layer of polysilicon 20 is deposited over the gate dielectric/polysilicon/SiGe stack shown in FIG. 4.

Figure 5:
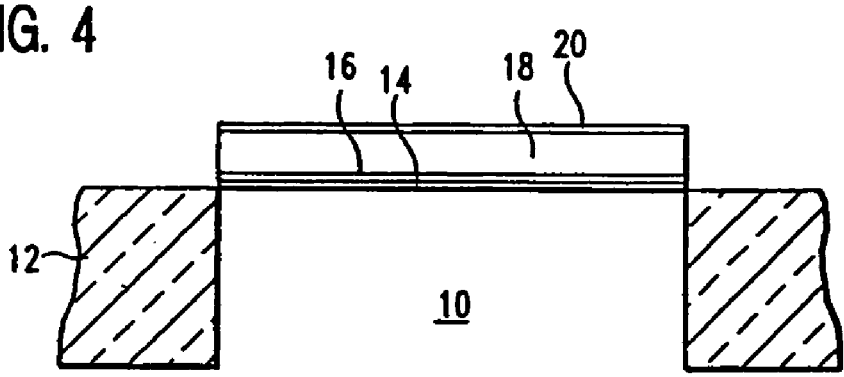
FIG. 5 is a cross-sectional view illustrating a subsequent stage after that of FIG. 4, after a second polysilicon layer is deposited over the SiGe layer.
Figure 6:
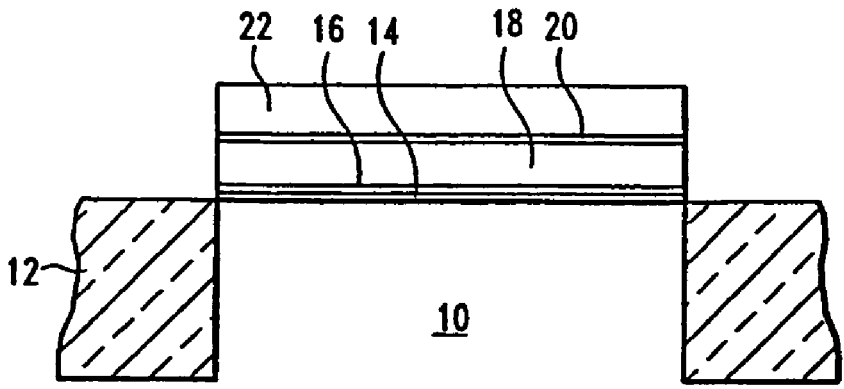
FIG. 6 is a cross-sectional view illustrating a subsequent stage, after a masking layer is deposited.

As shown in FIG. 6, a masking layer, shown at 22, is deposited over the stack of layers shown in FIG. 5. The purpose of the masking layer 22, among others, is to protect underlying areas from successive processing steps such as etching. A subsequent vertical etch, e.g. by reactive ion beam etching, to define the gate conductor 24, relies upon a masking layer 22 to protect layers in the gate stack from erosion during such etch. Masking layer 22 also provides protection in another etch process, as will be described more fully below. The masking layer 22 preferably includes one or more deposited hardmask layers such as silicon nitride, low density glass, e.g. from a tetraethylorthosilicate precursor (TEOS), or doped glass, e.g. borosilicate glass (BSG), borophosphosilicate glass (BPSG), or phosphosilicate glass (PSG).

Figure 7A:
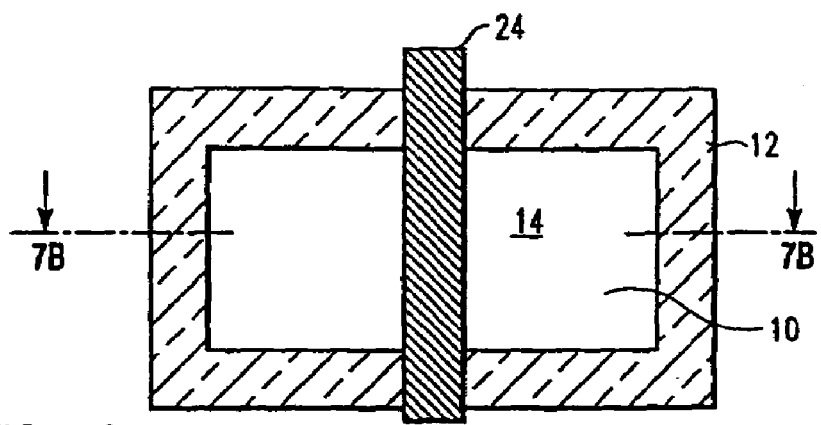
FIGS. 7A and 7B are a top-down view, and a cross-sectional view, respectively, illustrating a subsequent stage in which the deposited layers are etched to define a gate stack.
Figure 7B:
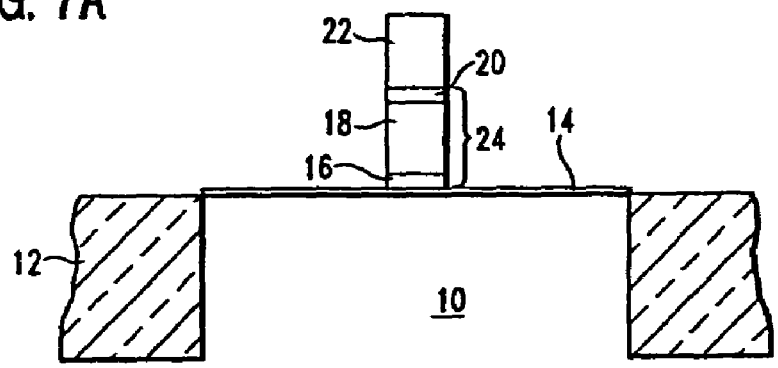

A subsequent stage in processing is shown in the top-down and cross-sectional views of FIGS. 7A and 7B. FIG. 7A shows a stage in forming the gate conductor 24, after patterning and etching the gate stack (of polysilicon layer 16, SiGe layer 18, and upper polysilicon layer 20), stopping on the underlying gate dielectric 14. Anistropic vertical etching, for example, by reactive ion beam etch, is the preferred means for etching the gate stack. At this point in processing, the etched gate conductor stack 24 has straight sidewalls, as remaining from the gate stack etch.

Figure 8A:
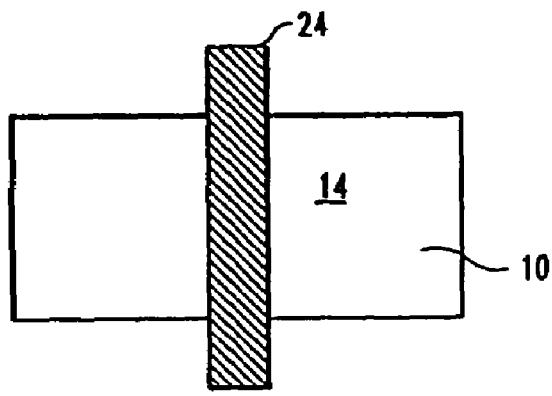
FIGS. 8A and 8B are a top down view, and a cross-sectional view, respectively, illustrating a subsequent stage in which portions of the gate stack are etched laterally.
Figure 8B:
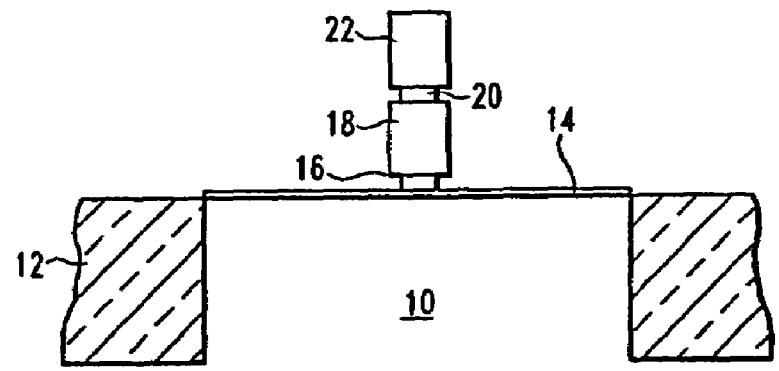

FIG. 8A provides a top-down view illustrating a next processing step in the embodiment of the invention after that shown in FIGS. 7A and 7B. FIGS. 8A and 8B illustrate the gate conductor 24, after being laterally etched to achieve a notched structure. FIG. 8B provides a cross-sectional view of the notched gate structure being achieved. As apparent in FIG. 8B, the first polysilicon layer 16 as well as the second polysilicon layer 20 have been etched to be not as broad as the SiGe layer or the masking layer 22. The first polysilicon layer 16 and the second polysilicon layer 20 are etched by an isotropic etch, selective to the material of the SiGe layer 18 and the masking layer 22. Isotropic etching can be performed by wet-etching or dry-etching techniques. Preferably, the isotropic etch is performed by a slow, wet etch process, in order to maintain good process control. A chemistry that includes ammonium hydroxide (NH4OH) is preferably used to provide well-controlled etching of the first polysilicon layer 16 and the second polysilicon layer 20.

The notched gate structure is achieved, as the first polysilicon layer 16 is protected on top by the covering SiGe layer 18, and etched only laterally, along the sidewalls in areas exposed to the etchant. Similarly, the second polysilicon layer 20 is protected on top by the masking layer 22, so that only the exposed areas along the sidewalls of that layer 20 are etched. The top surface of the second polysilicon layer 20 has to remain protected so that the silicide layer 28 (FIG. 1B) can be formed later.

The isotropic selective etch of the polysilicon layers 16 and 20 is preferably performed by a series of alternating steps Including 1) rinses by which a protective oxide is selectively grown on the exposed surface of the SiGe layer 18, and 2) wet etching the polysilicon layers 16 and 20, selective to the protected SiGe layer 18, with an etch chemistry including ammonium hydroxide (NH4OH). The etch chemistry, chemical concentration, and temperature are factors which can be varied to achieve the desired result, given the relative dimensions of the layers 16, 18 and 20, the amount of overhang of the first polysilicon layer 16 by the SiGe layer 18 to be achieved, and the etch rate needed for the throughput target.

Figure 9A:
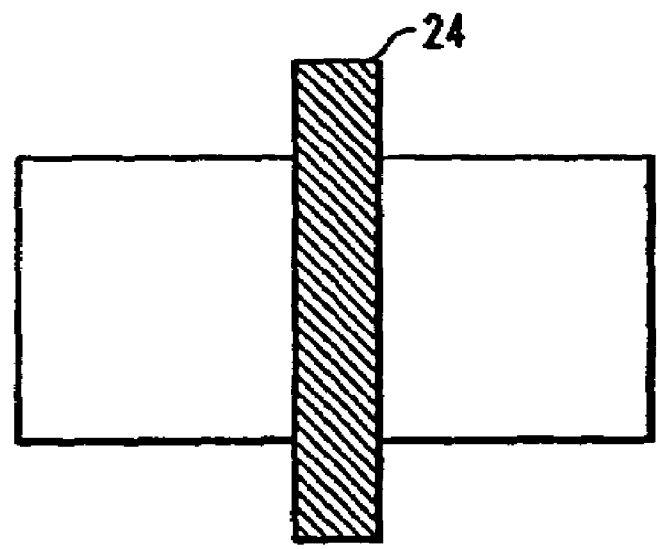
FIGS. 9A and 9B are a top down view and a cross-sectional view, respectively, illustrating a subsequent stage in which a masking layer is removed.
Figure 9B:
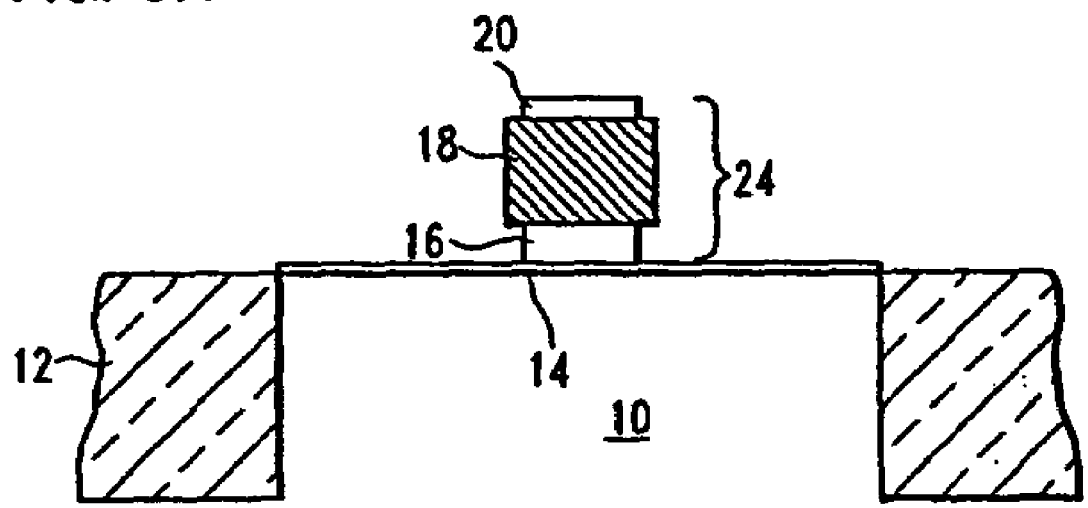

Next, as illustrated in FIGS. 9A and 9B, masking layer 22 is removed from the notched structure. Conventional methods such as those known to the persons skilled in the art of semiconductor fabrication can be used to achieve the removal of the masking layer 22. The masking layer is removed during this processing step after the lateral etch is performed because a notched structure has already been achieved and the top surface of the second polysilicon layer no longer needs protection. The masking layer 22 is removed to expose the top surface of the second polysilicon layer 20, so that a layer of silicide can ultimately be formed on this top surface, as shown at 28 in FIG. 1B.

Figure 10:
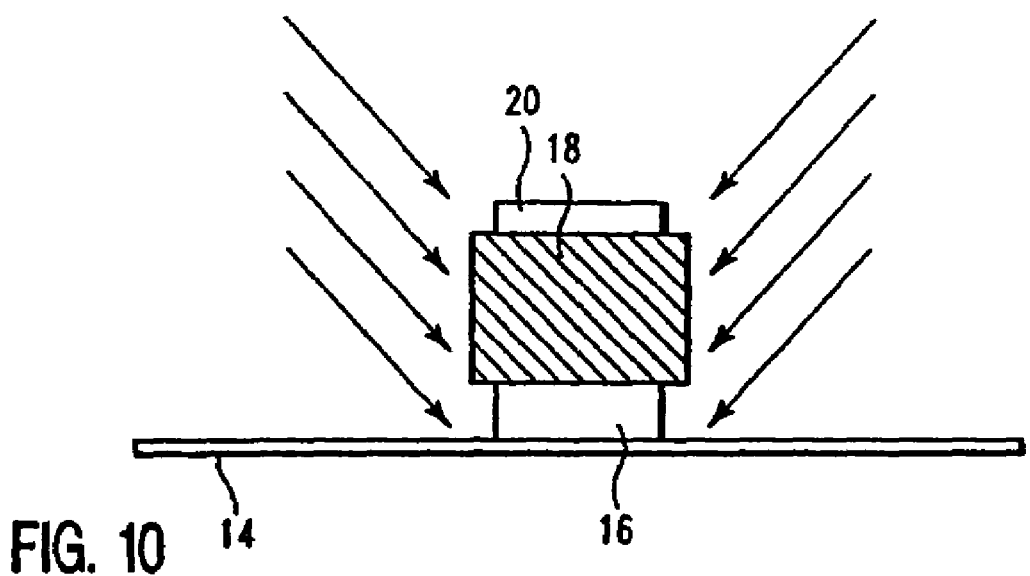
FIG. 10 is a cross-sectional view illustrating an implantation step for forming a pocket lightly doped drain (LDD) extension, subsequent to that shown in FIGS. 9A and 9B.

FIG. 10 illustrates a subsequent step in processing, in which a pocket (LDD) implantation is performed. The reason lightly doped drain (LDD) regions are implanted is to reduce short channel affects. LDD regions are formed in the surface of the substrate. After the LDD implantation step, the implanted ions are driven deeper and under the first polysilicon layer 16 of the substrate by heating the substrate, a process that at the same time cures damage to the surface of the substrate that the LDD ion implant may have caused.

Figure 11:
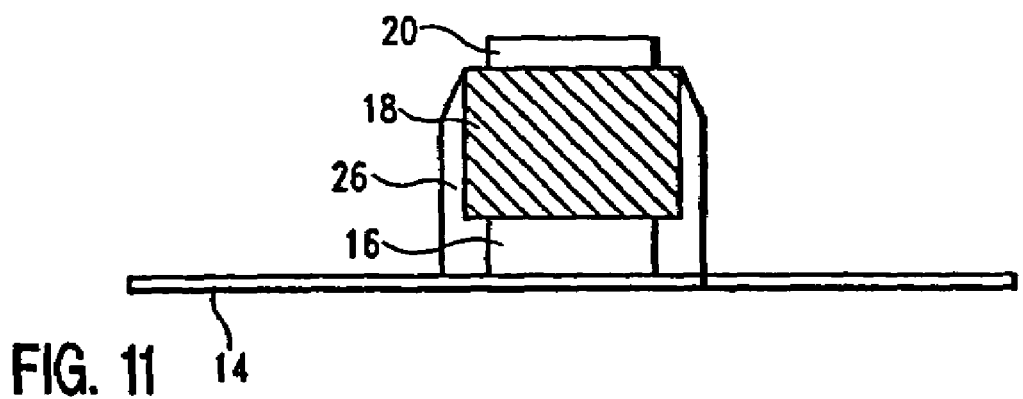
FIG. 11 is a cross-sectional view illustrating a processing stage in which spacer regions are formed on the sidewalls of the SiGe layer and the underlying polysilicon layer.
Figure 12:
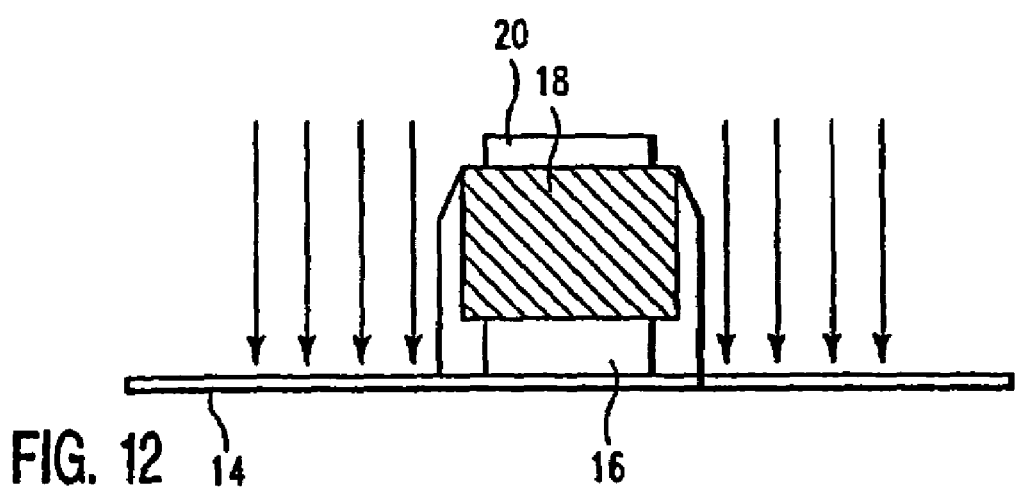
FIG. 12 is a cross-sectional view illustrating an extension implantation step, performed according to an embodiment of the method provided herein.

FIG. 11 illustrates the formation of sidewall spacers 26 on the sidewalls of the polysilicon layer 16 and the SiGe layer 18. The function of the sidewall spacers is to electrically isolate the gate electrode. A variety of different methods as known to those skilled in the art can be used. For example, a layer of silicon oxide or a layer of silicon nitride can be deposited and then vertically etched, e.g. by reactive ion beam etching, to form the desired sidewall spacers 26. The substrate may then be subjected to source/drain implants, and an optional extension implant, as shown in FIG. 12. At that time, a step of doping the gate conductor stack 24, including polysilicon layer 16, SiGe layer 18 and second polysilicon layer 20 can be performed.

Finally, as illustrated in FIGS. 1A and 1B, a silicidation process is performed to decrease the resistance of the gate conductor 24 and, if desired, surfaces of the source and drain regions 30. This is performed by depositing a layer of metal, e.g. tungsten over the gate conductor structure 24, including spacers 26, which have been thus formed. Then, through annealing at a sufficiently high temperature, the metal reacts with the exposed polysilicon 20 to form a silicide that is self-aligned to the location of the underlying exposed silicon. The term "salicide" denotes a silicide formed by such self-aligned technique.

After such annealing process to form the silicide, the remaining metal, not consumed and still not needed after the silicidation process, is removed from the substrate as by isotrophic etching, selective to silicide and other underlying materials.

If it is desired to provide a silicide at the surface of the source and drain regions 30 of the MOSFET, then any remaining gate dielectric 14 over the surface of the silicon substrate 10 is first removed prior to depositing the desired metal, e.g. tungsten, for reaction to form silicide. Then, the annealing and subsequent removal of unreacted metal are performed as above, resulting in silicided source and drain regions 30.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A metal oxide semiconductor field effect transistor (MOSFET) having a notched gate conductor structure, comprising:
    a gate dielectric formed on the surface of a semiconductor substrate;
    a gate conductor stack overlying said gate dielectric, said gate conductor stack including:
        a first gate conductor layer of polysilicon formed over said gate dielectric,
        a second gate conductor layer of silicon germanium (SiGe) formed over said first gate conductor layer, said second gate conductor layer being broader than, and overhanging said first gate conductor layer and
        a third gate conductor layer of polysilicon formed over said second gate conductor layer; and
    source and drain regions formed in said substrate on opposing sides of said gate conductor stack.

2. The MOSFET of claim 1 further including a silicide layer overlying said third gate conductor layer.

3. The MOSFET of claim 2 wherein said layer of silicide is a self-aligned (salicide) layer.

4. The MOSFET of claim 1 further comprising source and drain extensions overlapping said source and drain regions, implanted into said substrate.

5. The MOSFET of claim 4 further comprising insulating spacers on sidewalls of said first gate conductor layer and said second gate conductor layer.

6. The MOSFET of claim 5 wherein said insulating spacers comprise at least one of silicon dioxide and silicon nitride.

7. The MOSFET of claim 1, further comprising implanting pocket lightly doped drain (LDD) regions under sidewalls of said gate conductor stack.

8. The MOSFET of claim 1 further comprising a silicide formed in contact with top surfaces of said source and drain regions.

* * * * *